United States Patent
Choi et al.

(10) Patent No.: US 7,569,846 B2
(45) Date of Patent: Aug. 4, 2009

(54) PHASE-CHANGE MEMORY DEVICE INCLUDING NANOWIRES AND METHOD OF MANUFACTURING THE SAME

(75) Inventors: Chel-jong Choi, Osan-si (KR); Jong-bong Park, Osan-si (KR); Tae-gyu Kim, Hwaseong-si (KR); Dong-woo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/429,744

(22) Filed: May 8, 2006

(65) Prior Publication Data
US 2007/0012986 A1    Jan. 18, 2007

(30) Foreign Application Priority Data
May 7, 2005    (KR) .................. 10-2005-0038224

(51) Int. Cl.
*H01L 47/00* (2006.01)
(52) U.S. Cl. .................. 257/4; 257/5; 257/E45.002; 977/762
(58) Field of Classification Search .................. 257/3, 257/4, 5, 379, E45.002, E51.04, E29.17; 977/762
See application file for complete search history.

(56) References Cited

U.S. PATENT DOCUMENTS

| 7,060,543 B2* | 6/2006 | Choi et al. .................. 438/151 |
| 7,295,463 B2* | 11/2007 | Yang et al. .................. 365/163 |
| 2003/0179559 A1* | 9/2003 | Engelhardt et al. .......... 361/780 |
| 2005/0215049 A1* | 9/2005 | Horibe et al. ............... 438/622 |

FOREIGN PATENT DOCUMENTS

| JP | 2004-336054 A | 11/2004 |
| JP | 2008-505476 A | 2/2008 |
| WO | 03/050872 A1 | 6/2003 |
| WO | WO 2006/003620 A1 * | 6/2004 |
| WO | 2004/055825 A1 | 7/2004 |

OTHER PUBLICATIONS

Wolf et al.. "Silicon Processing for the VLSI Era: vol. 2, Process Integration." Lattice Press, Sunset Beach. 1990. p. 253.*

* cited by examiner

*Primary Examiner*—Minh-Loan T Tran
(74) *Attorney, Agent, or Firm*—Cantor Colburn LLP

(57) ABSTRACT

A phase-change random access memory (PRAM) device including a plurality of nanowires and a method of manufacturing the same include: a lower structure including a plurality of contact plugs; the nanowires extending into the contact plugs from surfaces defining a respective terminal end of the contact plugs; and a phase-change layer formed on top of the nanowires. Therefore, a reset or a set current consumed by the PRAM device is significantly reduced.

9 Claims, 14 Drawing Sheets

PHASE-CHANGE MEMORY DEVICE INCLUDING NANOWIRES AND METHOD OF MANUFACTURING THE SAME

This application claims priority to Korean Patent Application No. 10-2005-0038224, filed on May 7, 2005, and all the benefits accruing therefrom under 35 U.S.C. §119, and the contents of which in its entirety are herein incorporated by reference.

BACKGROUND OF THE INVENTION

1. Field of the Invention

The present invention relates to a phase-change random access memory ("PRAM") and a method of manufacturing the same, and more particularly, to a PRAM including nanowires and a method of manufacturing the PRAM, the PRAM having improved electrical characteristics by forming metal nanowires in a contact plug formed at a lower portion of a phase change layer.

2. Description of the Related Art

Phase-change materials undergo a structural transformation between crystalline and amorphous phases. The crystalline phase exhibits lower resistance relative to the amorphous phase and has an orderly atomic arrangement. The crystalline phase can be converted to the amorphous phase and vice versa. Phase-change random access memories ("PRAMs") are devices based on reversible phase change between crystalline and amorphous phases, which have distinctly different resistances.

Generally, PRAMs have a structure in which a contact plug is formed in a source region or a drain region of a transistor, and a phase-change layer and an upper electrode are sequentially formed on top of the contact plugs.

A method of storing data in a PRAM having the general structure described above is as follows. When a current is supplied through an electrode at a lower portion of the phase-change layer, Joule heat is generated in a region where a lower electrode and the phase-change layer contact each other. When the generated Joule heat becomes higher than a re-crystallization temperature, the structure of the phase-change layer is intentionally changed from a crystalline structure to an amorphous phase by appropriately controlling the supplied current. Since a resistance of the phase-change layer varies as it is changed to the amorphous phase, previously stored data values can be distinguished. To change the phase-change layer from the amorphous phase to the crystalline phase, crystallization occurs when a predetermined period of time passes at a temperature lower than a melting point. To change the phase-change layer from the crystalline phase to the amorphous phase, the temperature is increased to approximately the melting point (Tm) of the phase-change layer and then drastically cooled.

Various materials may be used in memory devices. An example of a commonly used material is a material from the chalcogenide family, that is, a GeSbTe (GST) family alloy. In order to improve the quality of PRAM memory devices, current that is supplied should be reduced. In particular, in a case of the most commonly used GST PRAM, a reset current needed to change from the crystalline phase to the amorphous phase is high.

Figure 1A:
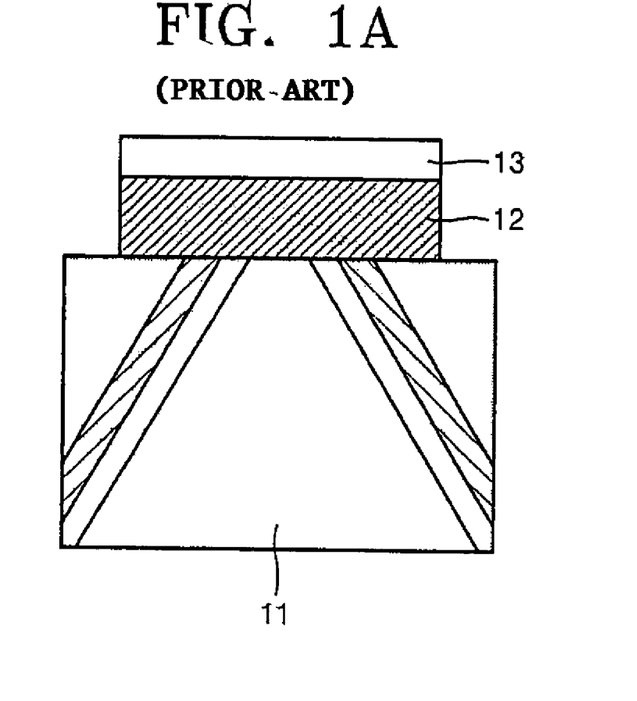
FIGS. 1A and 1B are cross-sectional views of a conventional phase-change memory device.
Figure 1B:
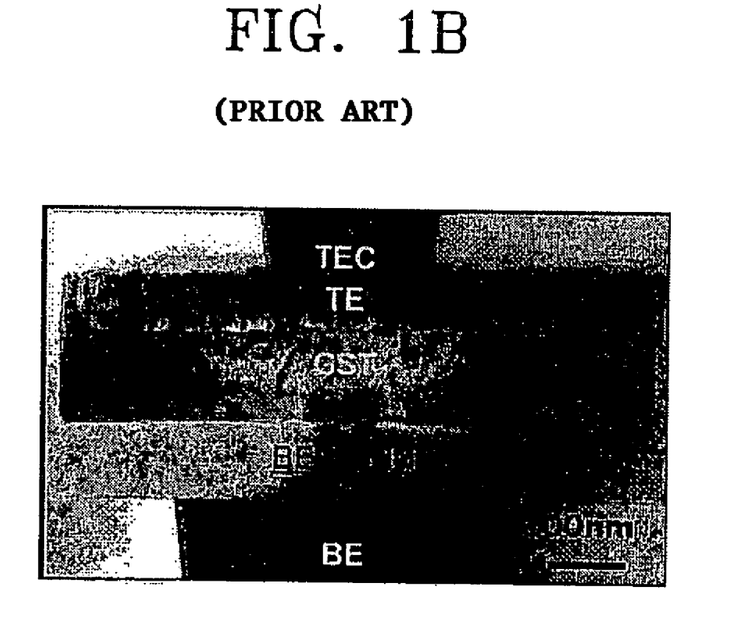

FIGS. 1A and 1B are views of a conventional phase-change memory device disclosed in U.S. Pat. No. 6,800,563.

Referring to FIG. 1A, a lower electrode 11 is formed on top of a substrate (not shown). A phase-change layer 12 and an upper electrode 13 are sequentially formed on top of the lower electrode 11. The width of the lower electrode 11 narrows towards the top of the lower electrode 11 to reduce the area of the lower electrode 11 contacting the phase-change layer 12. That is, by decreasing the area to which current is supplied, more heat is generated.

Referring to FIG. 1B, a lower portion of a GST phase-change layer does not directly contact a lower electrode (BE). Instead, a TiN layer having a narrow width is separately formed so that more heat can be generated from the supplied current.

The structure as illustrated in FIGS. 1A and 1B is for reducing the contact area between the phase-change layer 12 and the area of the lower electrode 11 beneath the phase-change layer 12 to which current is supplied. However, there is a limit to how much the contact area can be reduced due to technical limitations of a semiconductor process. Therefore, a PRAM device with a new structure is required.

BRIEF SUMMARY OF THE INVENTION

The present invention provides a PRAM device having a structure capable of minimizing a contact area of an electrode contacting a phase-change layer to reduce power consumption.

According to an exemplary embodiment of the present invention, a phase-change random access memory (PRAM) device includes a plurality of nanowires. The PRAM device further includes a lower structure having a plurality of contact plugs; the nanowires extending downwards from surfaces of the contact plugs; and a phase-change layer formed on the contact plugs.

The lower structure may include a semiconductor substrate; a source region and a drain region formed at sides of the semiconductor substrate; a gate insulating layer and a gate electrode layer sequentially formed on the semiconductor substrate, the gate insulating layer contacting the source region and the drain region; and the contact plugs respectively formed on the source region and the drain region.

Each of the contact plugs may be formed of at least one selected from the group consisting of Si, $SiO_2$, SiGe, GaAs, GaN and SiC.

Each of the nanowires may be formed of at least one selected from the group consisting of Au, Ag, Al, Cu, Cr, Co, Ni, Ti, Sb, V, Mo, Ta, Nb, Ru, W, Pt, Pd, Zn and Mg.

The phase-change layer may be formed of a GeSbTe.

An upper electrode may be further formed on the phase-change layer.

A metal layer may be further formed beneath the contact plugs.

According to another exemplary embodiment of the present invention, a method of manufacturing a PRAM device includes forming a lower structure including a plurality of contact plugs; injecting a metal into the contact plugs; forming a plurality of nanowires extending downwards from surfaces of the contact plugs by thermally processing the contact plugs; and forming a phase-change layer on the contact plugs.

According to the present invention, the forming of the lower structure may include sequentially forming a gate insulating layer and a gate electrode layer on a semiconductor substrate; exposing both sides of the semiconductor substrate by etching sides of the gate insulating layer and the gate electrode layer; forming a source region and a drain region by doping impurities into both exposed sides of the semiconductor substrate; and forming contact plugs on the source region and the drain region.

According to the present invention, the forming of the contact plugs may include forming an intermediate insulating layer by depositing an insulating material on the gate electrode layer, the source region and the drain region; forming holes in the intermediate insulating layer to expose the source region and the drain region by etching the intermediate insulating layer; and depositing a contact plug material inside the holes.

According to the present invention, the forming of the contact plugs may include forming an intermediate insulating layer by depositing an insulating material on the gate electrode layer, the source region and the drain region; forming holes in the intermediate insulating layer to expose the source region and the drain region by etching the intermediate insulating layer; and forming metal layers in the holes by depositing a metal material inside the holes and depositing a contact plug material on the metal layers.

In the forming of the nanowires, a laser beam having an energy density in the range of about 300 mJ/cm$^2$ to about 2,000 mJ/cm$^2$ may be emitted onto the surfaces of the contact plugs.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described more fully with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, lengths and sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or"includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
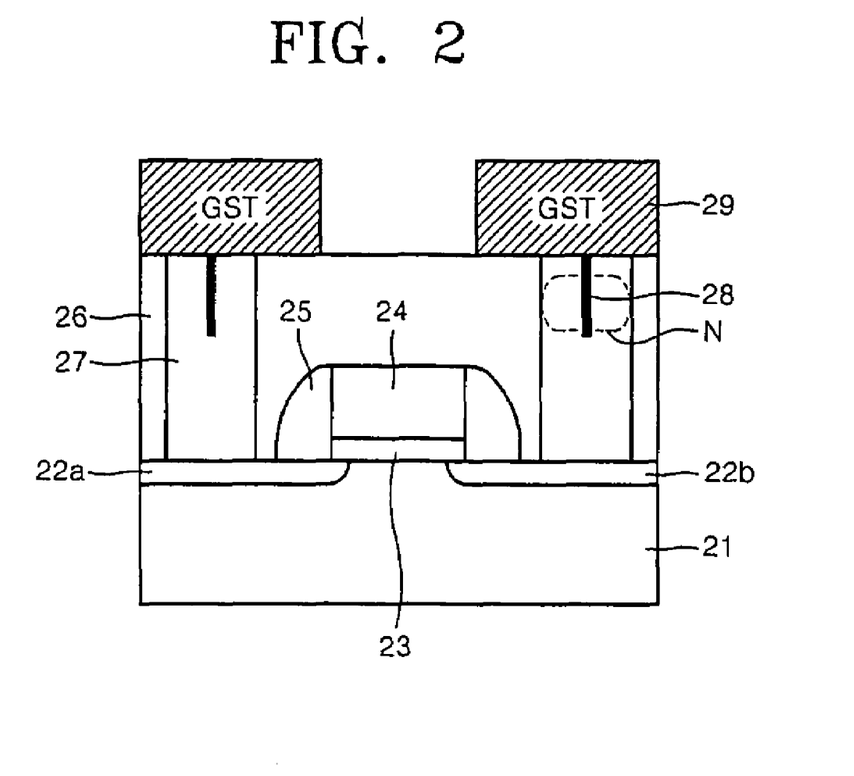
FIG. 2 is a cross-sectional view of an exemplary embodiment of a phase-change memory device according to the present invention.

FIG. 2 is a cross-sectional view of an exemplary embodiment of a PRAM according to the present invention. Referring to FIG. 2, a source region 22a and a drain region 22b are formed on each side of a substrate 21. A gate structure is formed on the substrate 21, contacting the source region 22a and the drain region 22b. An insulating layer 23 and a gate electrode layer 24 are sequentially formed as the gate structure. Such a structure is a common transistor structure. An intermediate insulating layer 26 is formed on the transistor structure, and contact plugs 27 are formed in the intermediate insulating layer 26 on top of the source region 22a and the drain region 22b, respectively. Phase-change layers 29 are respectively formed on top of the contact plugs 27. Nanowires 28 are respectively formed on bottom surfaces of the phase-change layers 29, extending vertically downward as illustrated, inside the contact plugs 27.

The substrate 21 may be formed of Si, SiC, etc., which is used in a common substrate of a semiconductor device. The gate insulating layer 23 in the gate structure may be formed of an insulating material such as $SiO_2$, and the gate electrode layer 24 may be formed of commonly used metallic or non-metallic conductive materials.

The contacts plugs 27 formed on top of the source region 22a and the drain region 22b may be formed of at least one of Si, $SiO_2$, SiGe, GaAs, GaN and SiC. The nanowires 28 are formed by ion injecting a metal material into the contact plugs 27. The metal material may be, but is not limited to, Au, Ag, Al, Cu, Cr, Co, Ni, Ti, Sb, V, Mo, Ta, Nb, Ru, W, Pt, Pd, Zn or Mg.

A method of manufacturing the PRAM illustrated in FIG. 2 according to another exemplary embodiment of the present invention is described below. FIGS. 3A through 3H are cross-sectional views illustrating an exemplary embodiment of a method of manufacturing the PRAM illustrated in FIG. 2 according to the present invention.

Figure 3A:
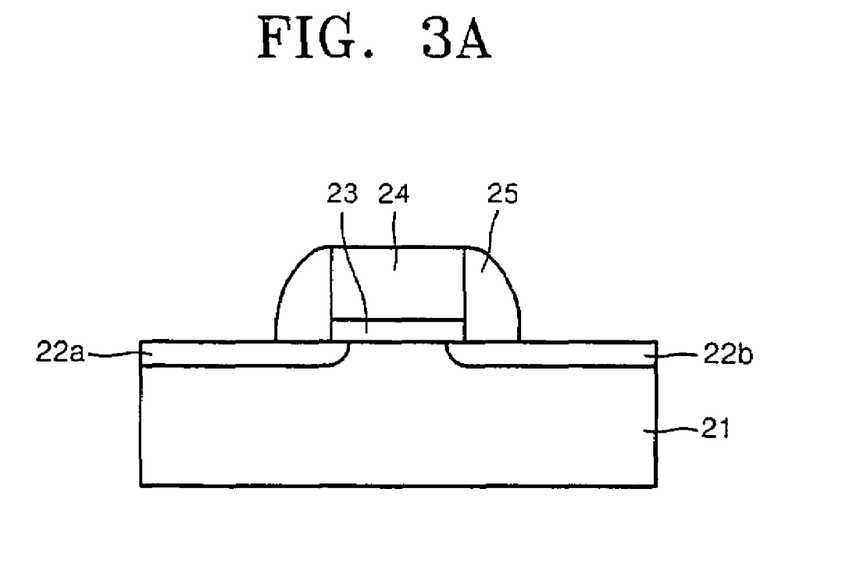
FIGS. 3A through 3H are cross-sectional views illustrating an exemplary embodiment of a method of manufacturing a phase-change memory device according to the present invention.

FIG. 3A is a cross-sectional view of the transistor structure of a lower portion of the PRAM illustrated in FIG. 2. Such a structure can be manufactured using a general semiconductor process as follows. First, a gate insulating layer 23 is formed by depositing an insulating material, such as $SiO_2$, on top of a semiconductor substrate formed of Si, for example. Thereafter, a metallic or non-metallic material is formed on the gate insulating layer 23 to form a gate electrode layer 24. The gate insulating layer 23 and the gate electrode layer 24 form a gate structure. Both sides of the gate insulating layer 23 and the gate electrode layer 24 are removed, thereby exposing the top surface of the substrate 21. Thereafter, a dopant is injected into the substrate 21 through the top surface of the exposed substrate 21 using, for example, an ion injection process. When forming sides of the gate structure to be very narrow in a thermal process performed after the dopant is injected, a source region 22a and a drain region 22b formed in the substrate 21 beneath the gate insulating layer 23 can overlap due to diffusion caused by the thermal process. Therefore, generally, a low concentration doping process is performed. Side walls 25 are formed on both sides of the gate structure, as illustrated in FIG. 3A, and then a high concentration doping process, which is optional, is performed. As a result, the transistor structure is formed.

Figure 3B:
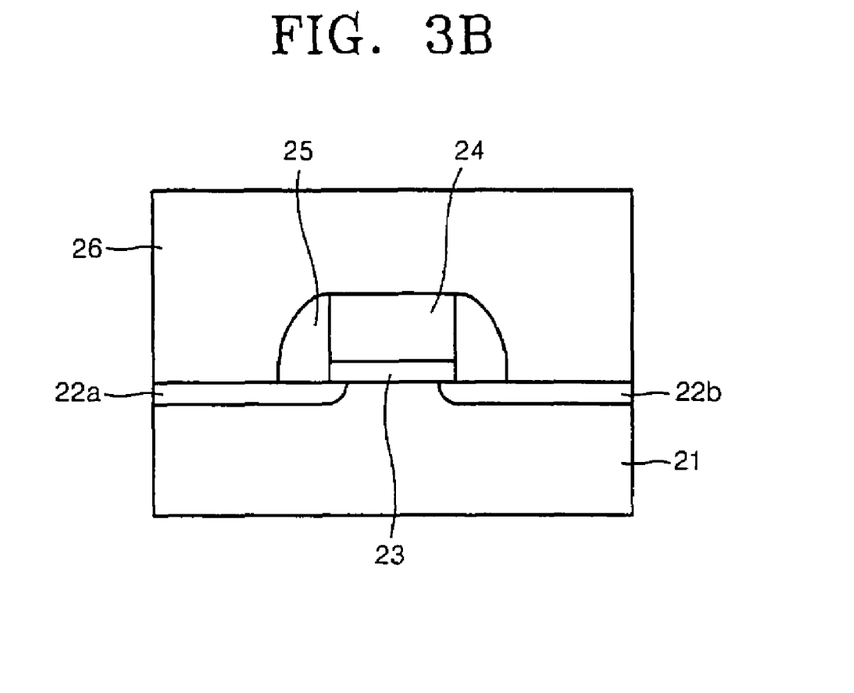
Figure 3C:
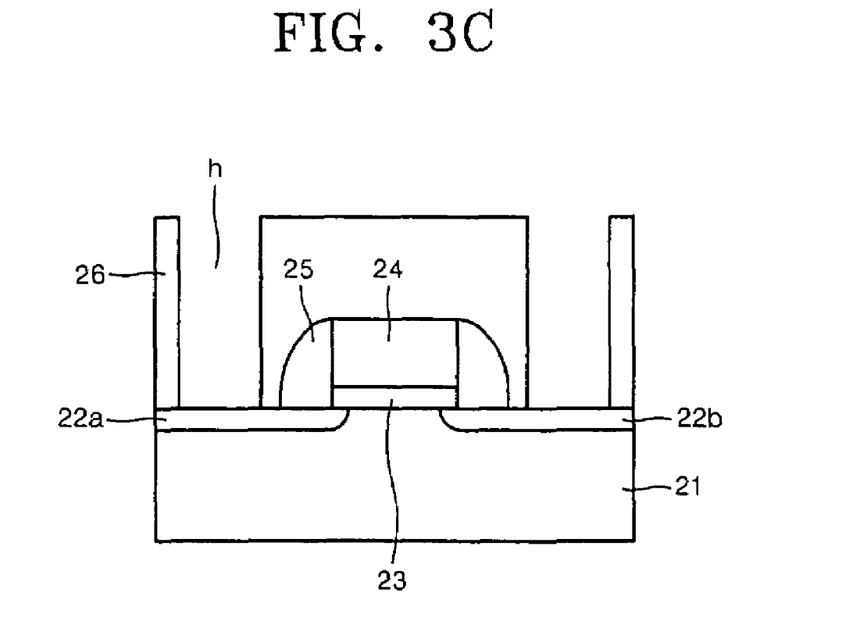
Figure 3D:
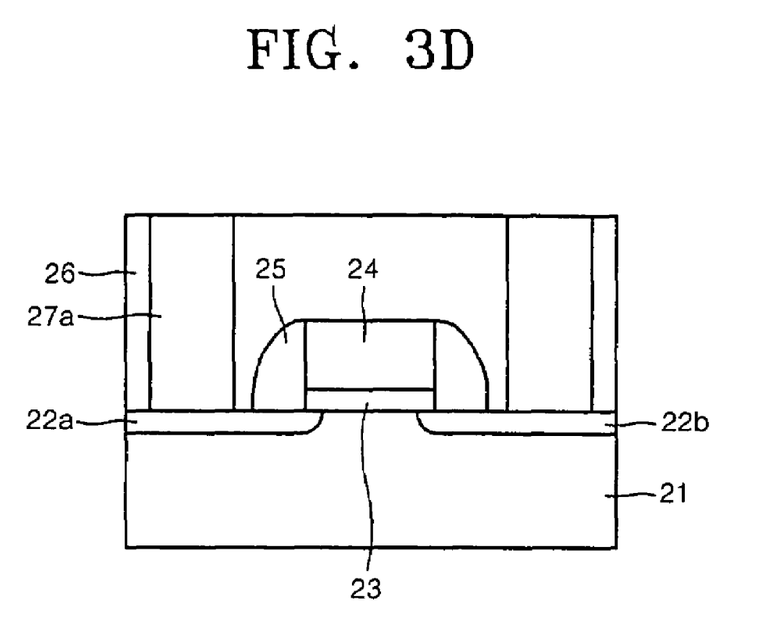

Referring to FIG. 3B, an insulating material is deposited on top of the transistor structure to form an intermediate insulating layer 26. The insulating material is not limited to a certain material, and may typically be $SiO_2$. Referring to FIG. 3C, materials such as Si, $SiO_2$, SiGe, GaAs, GaN or SiC are deposited inside holes h to form contact plugs 27a illustrated in FIG. 3D. In the resultant structure, the contact plugs 27a formed on top of the source region 22a and the drain region 22b are in an amorphous phase since they have not gone through the thermal process.

Figure 3E:
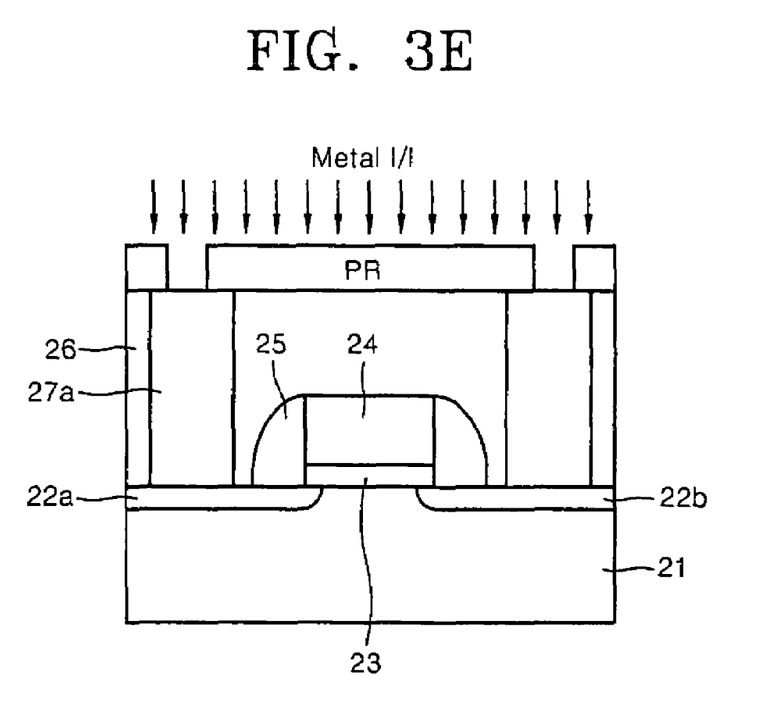

Referring to FIG. 3E, photoresist ("PR") is deposited on top of the intermediate insulating layer 26, and the PR on top of the contact plugs 27a is removed so that the contact plugs 27a are exposed. Metal ions formed of Au, Ag, Al, Cu, Cr, Co, Ni, Ti, Sb, V, Mo, Ta, Nb, Ru, W, Pt, Pd, Zn or Mg are injected into the contact plugs 27a using, for example, an ion injection process. The energy required for the ion injection process may range from about 1 keV to about 1 MeV. The doping amount of the injected metal ions may range from about $10^{10}$ atoms/$cm^2$ to about $10^{17}$ atoms/$cm^2$. The metal ions penetrate into the contact plugs 27a by the ion injection process of the metal ion.

Figure 3F:
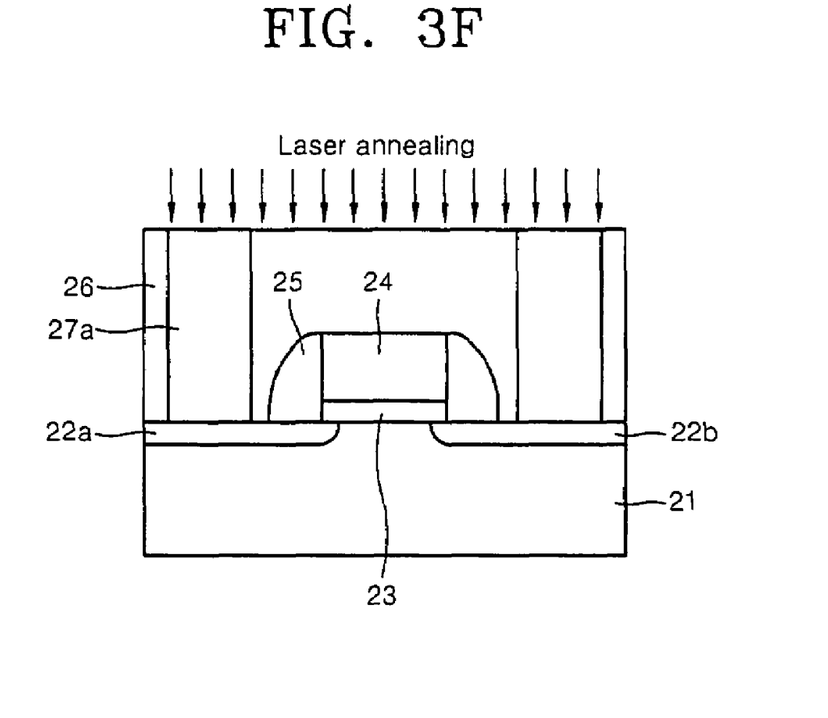

Referring to FIG. 3F, after removing the PR, a laser beam is emitted onto the contact plugs 27a from above the contact plugs 27a to perform an annealing process to form nanowires inside the contact plugs 27a. The energy density of the emitted laser beam may range from about 300 mJ/$cm^2$ to about 2,000 mJ/$cm^2$.

Figure 3G:
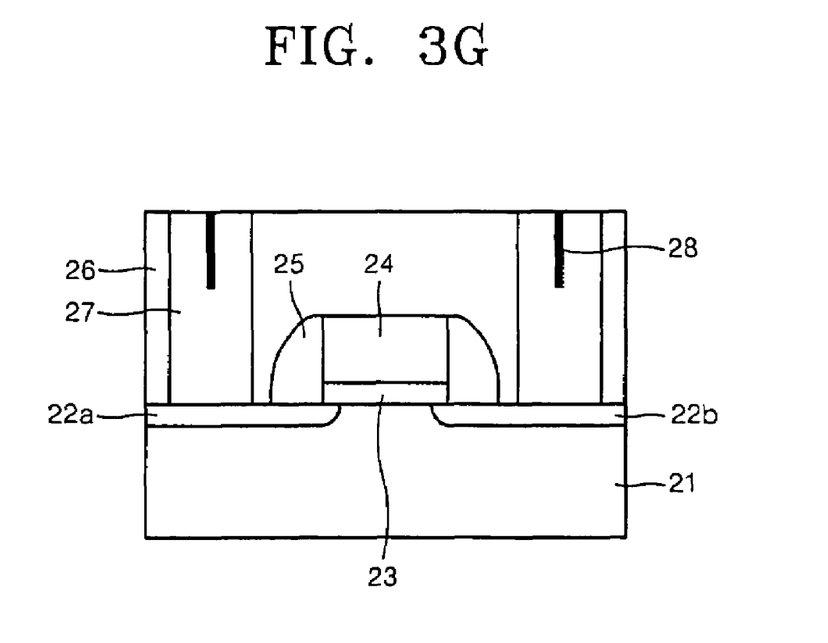

Referring to FIG. 3G, the contact plugs 27a in the amorphous phase are converted into contact plugs 27 in a crystalline phase having a plurality of grains using the annealing process performed using the laser beam described above. Nanowires 28 extending from top surfaces of the contact plugs 27 are respectively formed inside the contact plugs 27. The following is a more detailed description.

For example, when the contact plugs 27 are formed of Si, the insides of the contact plugs 27 go through nucleation and grain growth processes when performing the thermal process using the laser beam. Therefore, grain boundaries, caused by crystal growth, are formed inside the contact plugs 27, and the metal ions, for example, silicide, stably grow nano-scaled nanowires from the grain boundaries. The nanowires 28 can also be grown at an angle, besides growing perpendicular to top surfaces of the contact plugs 27.

Figure 3H:
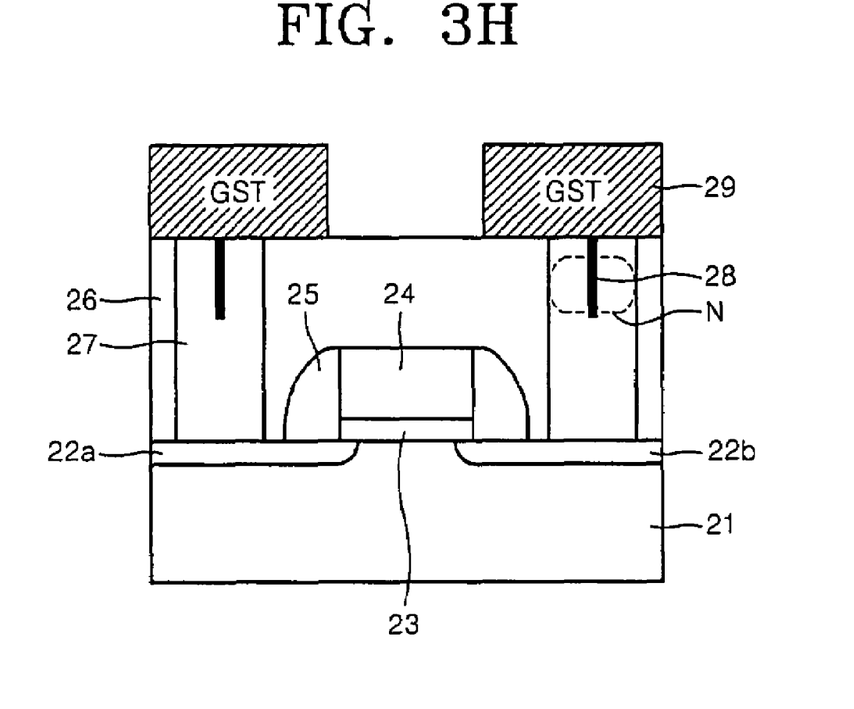
Figure 5:
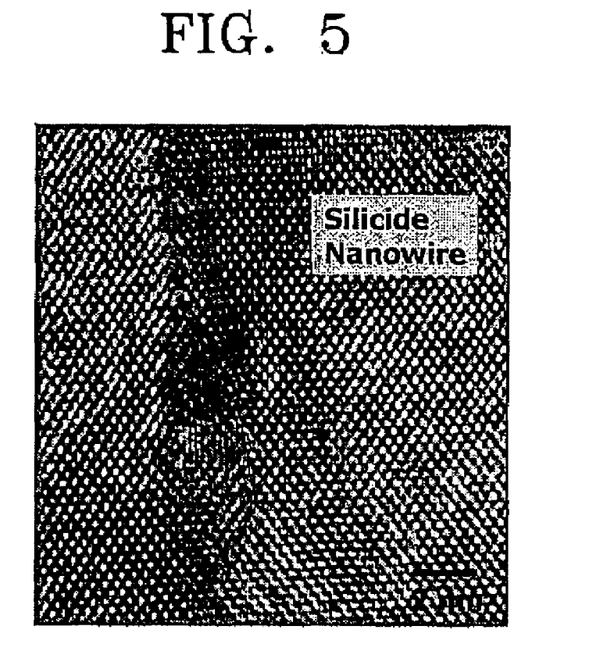
FIG. 5 is a TEM image of a region of a nanowire in the phase-change memory device illustrated in FIG. 3H.

Referring to FIG. 3H, phase-change layers 29 such as GSTs are respectively formed on top of the contact plugs 27 in which the nanowires 28 are formed perpendicular to the phase-change layers 29, thus completing the formation of the PRAM. An upper electrode (not shown) may be further formed on top of the PRAM. An image of the cross-section of a region N illustrated in FIG. 3H taken with a TEM is illustrated in FIG. 5. Referring to FIG. 5, after Mo ions are ion injected into a Si contact plug, a laser beam is emitted to perform a thermal process. The light portions indicate the Si layer and the dark portions indicate the silicide nanowires. Here, it can be seen that the width of the nanowires is about 2 nm or more.

Another exemplary embodiment of a method of manufacturing a PRAM according to the present invention will be described with reference to FIGS. 4A through 4I below.

Figure 4A:
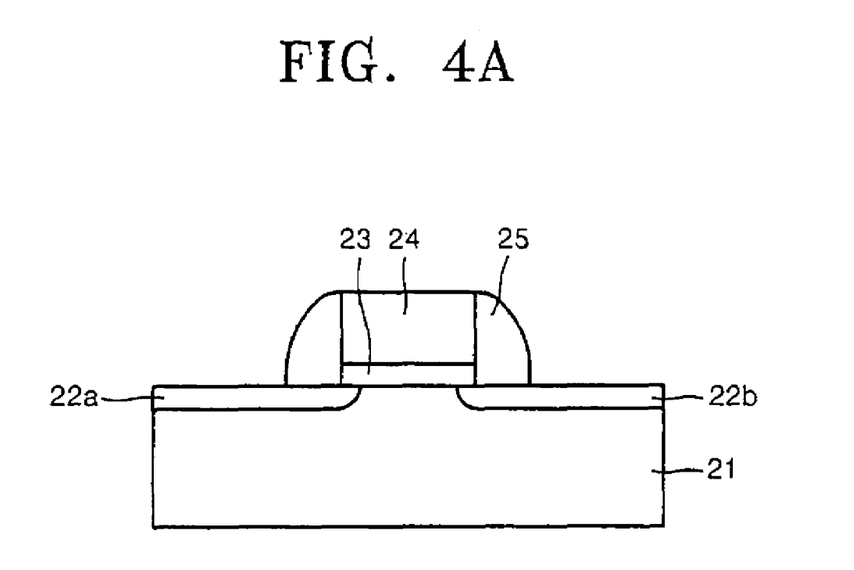
FIGS. 4A through 4I are cross-sectional views illustrating another exemplary embodiment of a method of manufacturing a phase-change memory device according to the present invention.
Figure 4B:
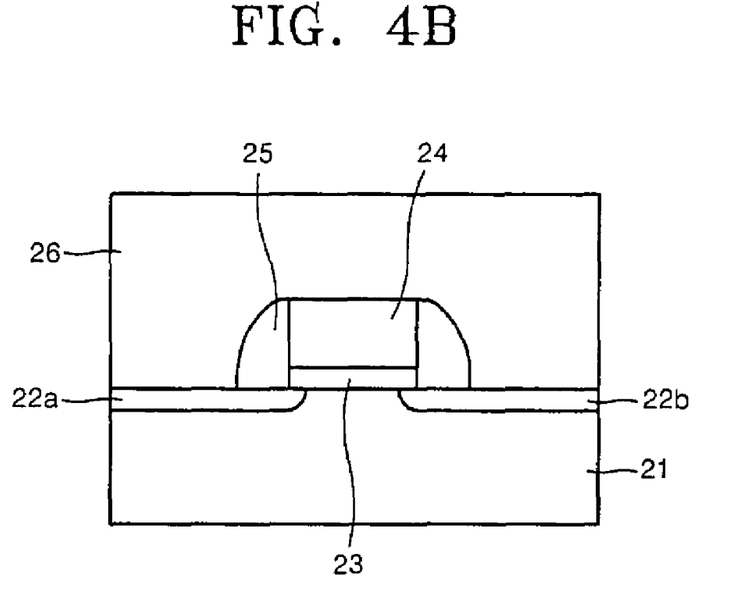
Figure 4C:
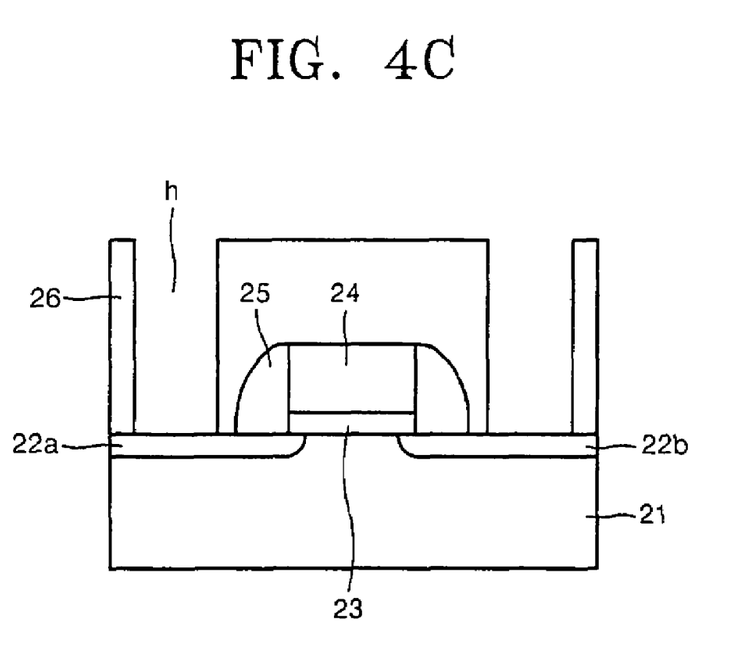

FIGS. 4A through 4C illustrate the same manufacturing process as illustrated in FIGS. 3A through 3C. Therefore, the description regarding FIGS. 3A through 3C also applies to FIGS. 4A through 4C.

Figure 4D:
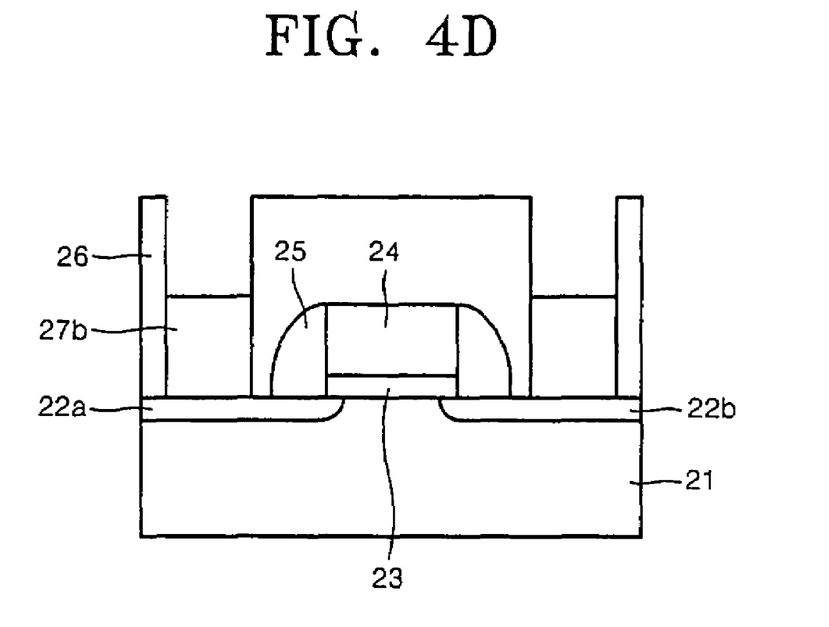

Referring to FIG. 4D, metal layers 27b are formed on top of a source region 22a and a drain region 22b by depositing a metal such as Au, Ag, Al, Cu, Cr, Co, Ni, Ti, Sb, V, Mo, Ta, Nb, Ru, W, Pt, Pd, Zn or Mg. Surfaces of the source region 22a and the drain region 22b are exposed via holes h (FIG. 4C) formed in an intermediate insulating layer 26. The metal layers 27b are deposited up to a middle portion of the holes h.

Figure 4E:
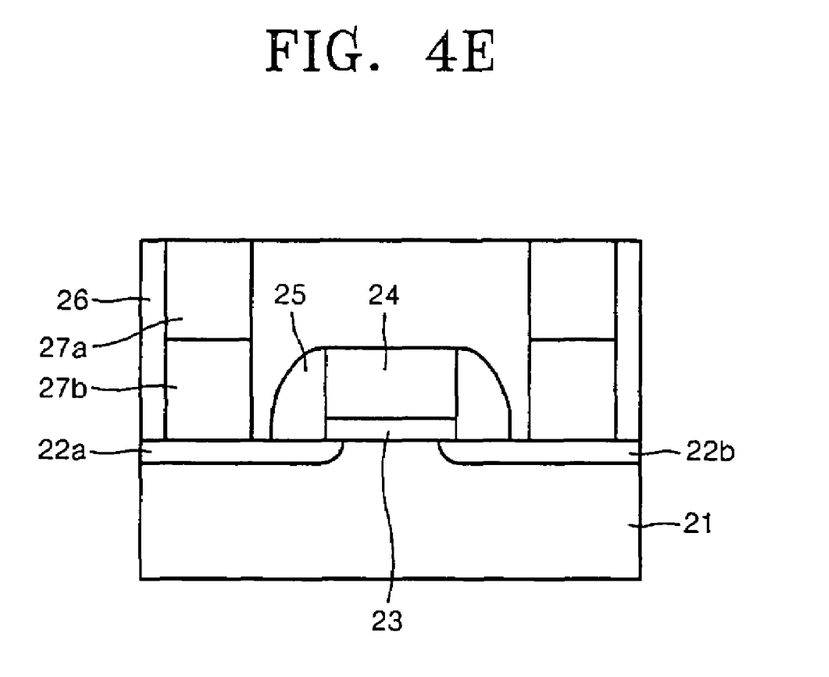

Referring to FIG. 4E, contact plugs 27a are formed by depositing a material such as Si, $SiO_2$, SiGe, GaAs, GaN or SiC on top of the respective metal layers 27b inside the holes h. The contact plugs 27 are in an amorphous phase since the source region 22a and the drain region 22b have not gone through the thermal process.

Figure 4F:
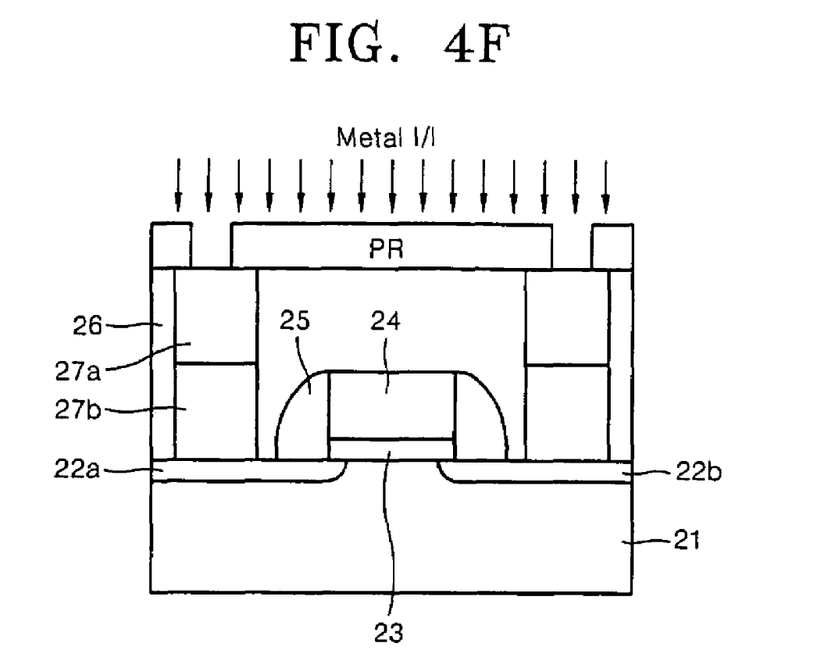

Referring to FIG. 4F, a PR is deposited on top of the intermediate layer 26 and the contact plugs 27a, and the PR on top of the contact plugs 27a is removed so that the contact plugs 27a are exposed. Metal ions such as Au, Ag, Al, Cu, Cr, Co, Ni, Ti, Sb, V, Mo, Ta, Nb, Ru, W, Pt, Pd, Zn or Mg are doped into the exposed contact plugs 27a using, for example, an ion injection process. The energy required for the ion injection process may range from about 1 keV to about 1 MeV. The doping amount of the injected metal ions may range from about $10^{10}$ atoms/$cm^2$ to about $10^{17}$ atoms/$cm^2$. The metal ions penetrate into the contact plugs 27a by the ion injection process of the metal ion.

Figure 4G:
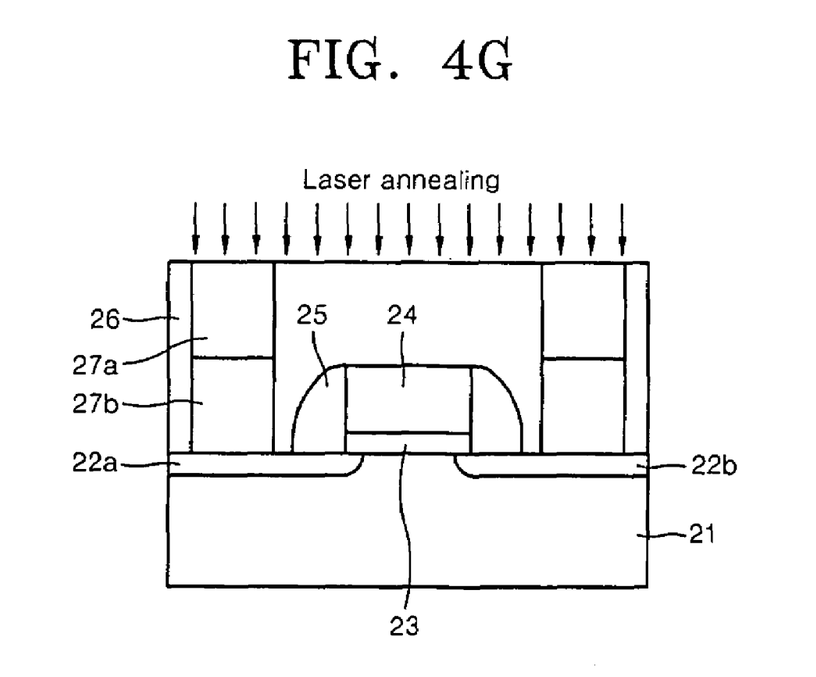

Referring to FIG. 4G, after removing the PR, a laser beam is emitted onto the contact plugs 27a to perform an annealing process to form nanowires inside the contact plugs 27a. The energy density of the emitted laser beam may range from about 300 mJ/$cm^2$ to about 2,000 mJ/$cm^2$.

Figure 4H:
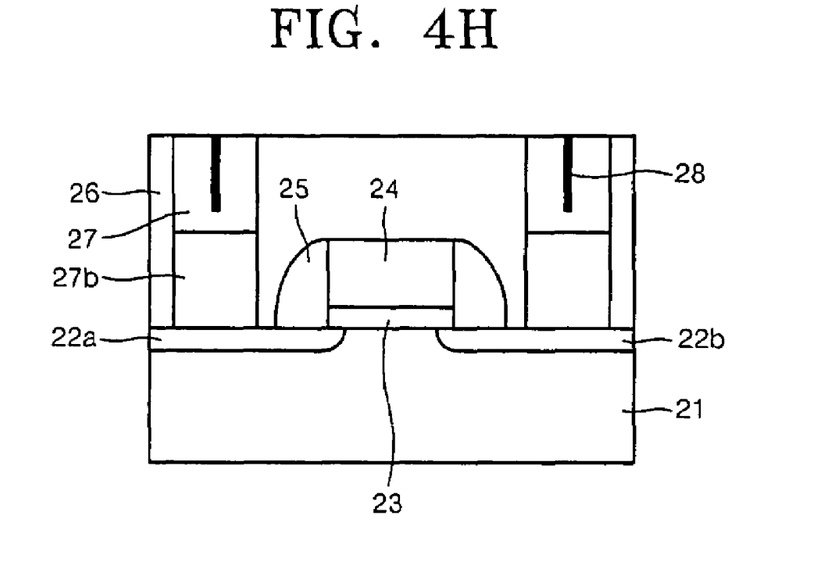

Referring to FIG. 4H, the contact plugs 27a in the amorphous phase are converted into contact plugs 27 in a crystalline phase having a plurality of grains when using the laser beam to perform the annealing process. Nanowires 28 extending from top surfaces of the contact plugs 27 are respectively formed inside the contact plugs 27.

Figure 4I:
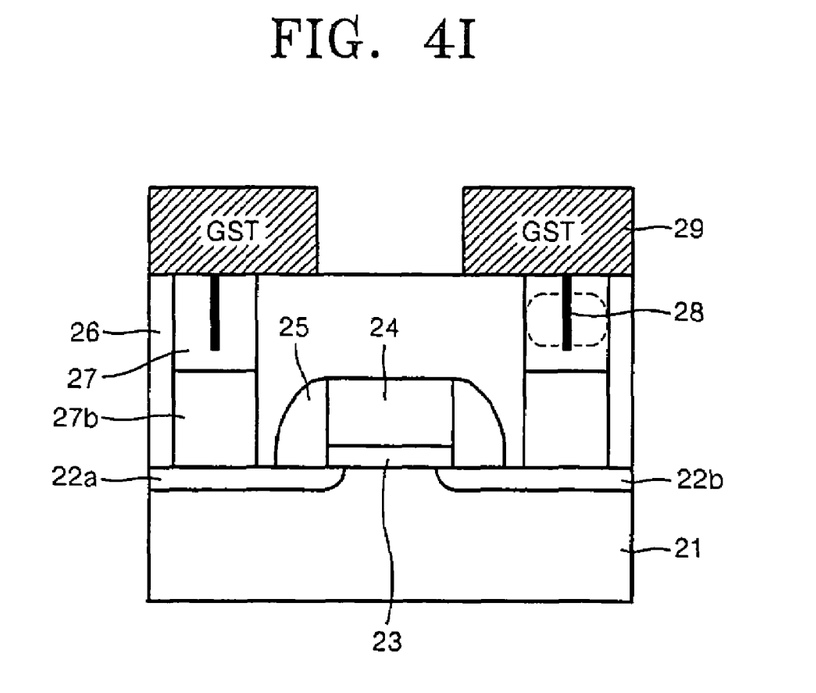

Referring to FIG. 4I, phase-change layers 29, such as GSTs for example, are respectively formed on top of the contact plugs 27 in which the nanowires 28 are formed perpendicular to the phase-change layers 29, thus completing the formation of the PRAM. Generally, an upper electrode (not shown) is further formed on top of the PRAM.

Figure 6:
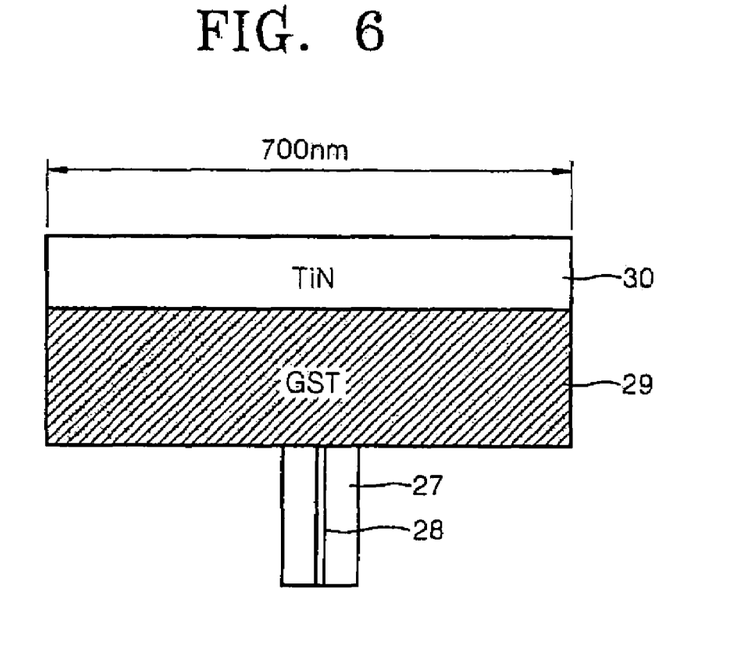
FIG. 6 is a cross-sectional view of a nanowire and a phase-change layer of a PRAM manufactured according to an exemplary embodiment of the present invention.

Below, a PRAM having a structure as illustrated in FIG. 6 was manufactured to check the effects of the present invention. The simulation conditions are as shown in Table 1.

TABLE 1

(Analysis Condition: Real Scale, Heat Insulating Condition, Analysis Time: 25 ns)

|  | Electrical Resistivity ($\Box$m) | Thermal Conductivity (W/m K) | Density (kg/$m^3$) | Heat Capacitor (J/kg K) |
| --- | --- | --- | --- | --- |
| GST | 0.0001 | 1.8 | 6200 | 193.5 |
| TiN | 1E-6 | 13 | 5400 | 599 |
| $MoSi_2$ | 2.15E-7 | 53.92 | 6240 | 418.4 |
| Si | 13 | 149 | 2330 | 702.2 |

Figure 7A:
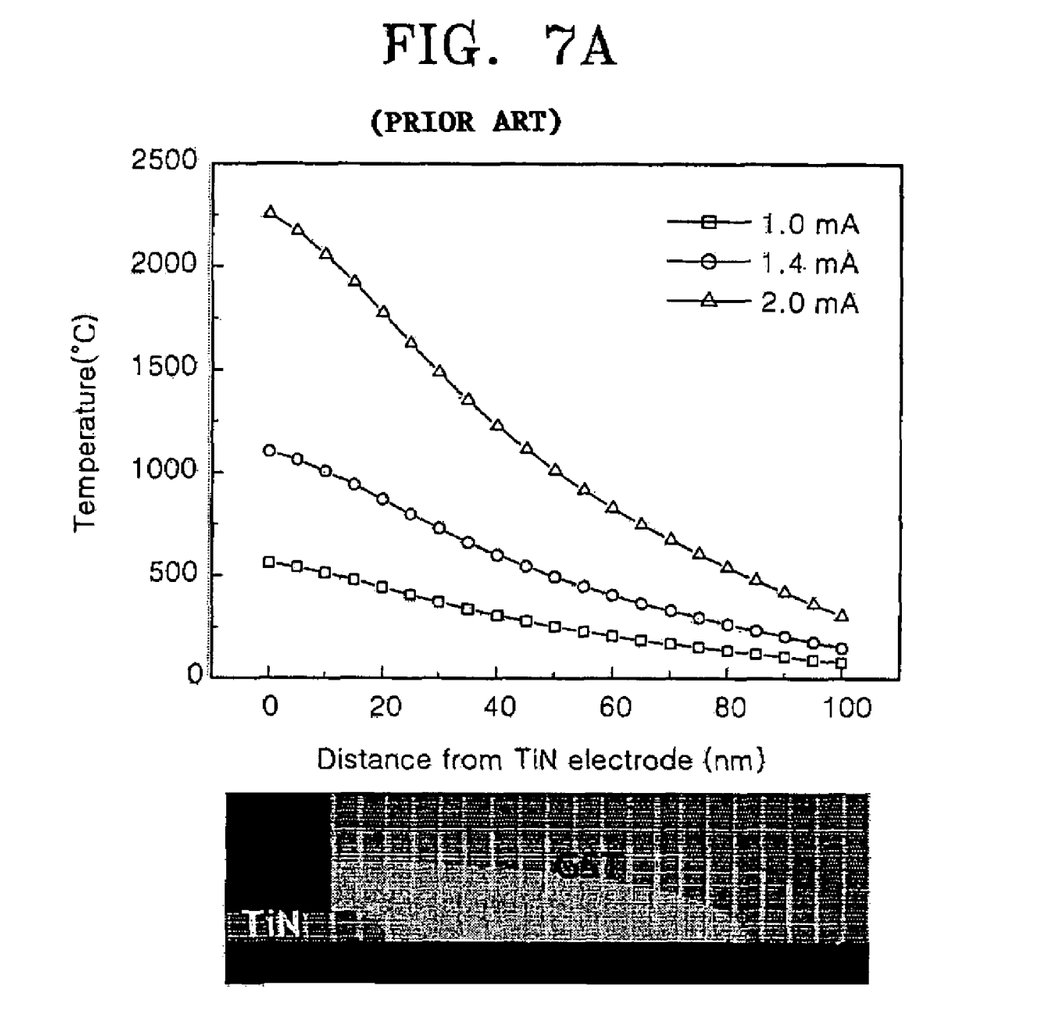
FIGS. 7A is a graph illustrating temperatures of a phase-change layer after a predetermined current is supplied to a contact plug of a conventional PRAM.

FIG. 7A is a graph illustrating temperatures of a phase-change layer when currents of 1.0 mA, 1.4 mA and 2.0 mA are supplied to a conventional PRAM sample where a contact plug is formed of TiN and nanowires are not formed. Referring to FIG. 7A, the temperature of the phase-change layer gradually decreased as the distance from the contact plug increased from 0 to 100 nm. Also, the temperature of the phase-change layer drastically increased as current supplied to the contact plug was increased.

Figure 7B:
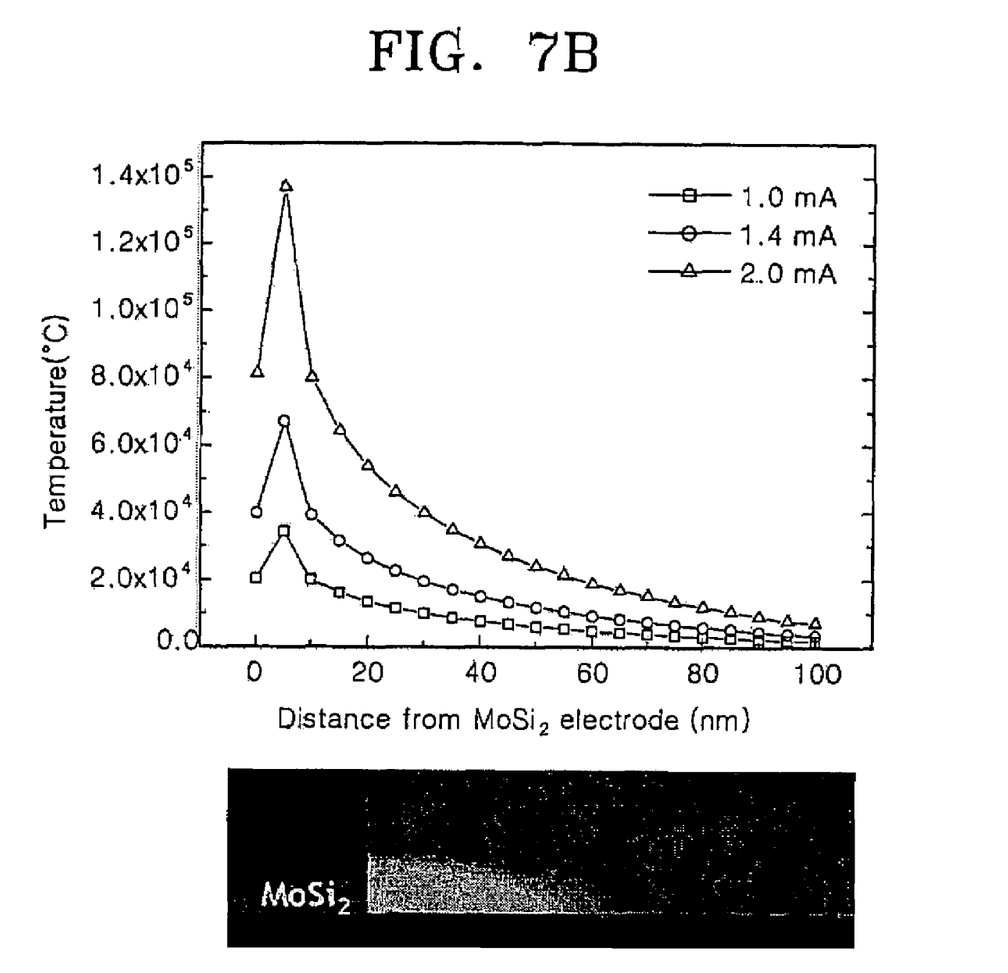
FIG. 7B is a graph illustrating temperatures of a phase-change layer after a predetermined current is supplied to a contact plug of a PRAM sample of the present invention, as illustrated in FIG. 6.

FIG. 7B is a graph illustrating the temperatures of a phase-change layer 29 obtained after currents of 1.0 mA, 1.4 mA and 2.0 mA are supplied to a PRAM sample of the present invention having the structure as illustrated in FIG. 6 where a contact plug 27 is formed of TiN and a nanowire 28 is formed of $MoSi_2$. Referring to FIG. 7B, the temperature of the phase-change layer 29 of FIG. 6 gradually decreased as the distance from the contact plug 27 increased from 0 to 100 nm. Also, the temperature of the phase-change electrode 29 drastically increased as current supplied to the contact plug was increased. However, while the temperature of the phase-change layer 29 increased to a maximum of about 2,300° C. when a current of 2.0 mA was supplied in FIG. 7A, the maximum temperature to which the phase-change layer 29 increased was $1.3 \times 10^5$° C. in FIG. 7B.

Figure 7C:
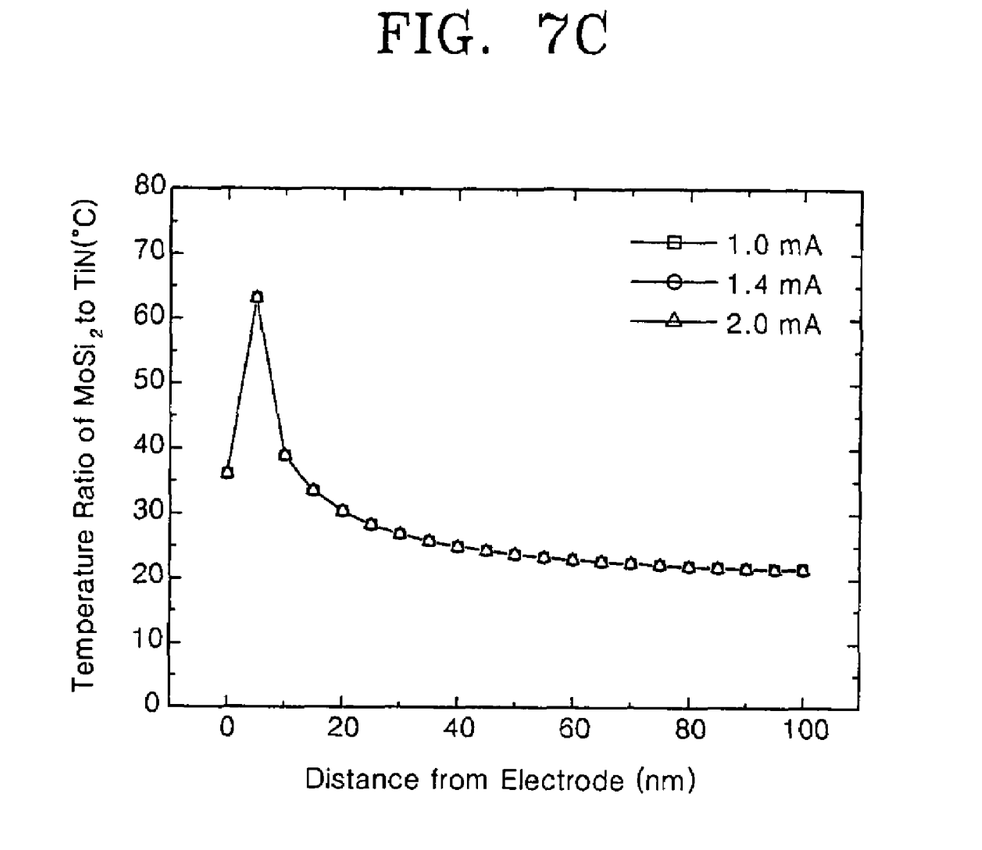
FIG. 7C is a graph illustrating a temperature ratio of the phase-change layer 29 of FIGS. 6 and 7B to the phase-change layer in FIG. 7A at the same temperature when the same current is supplied using the results illustrated in FIGS. 7A and 7B.

FIG. 7C is a graph illustrating a temperature ratio of the phase-change layer (29 of FIG. 6) in FIG. 7b to the phase-change layer in FIG. 7A at the same temperature when the same current is supplied using the results illustrated in FIGS. 7A and 7B. Referring to FIG. 7C, it can be seen that there is a maximum temperature increase 60 times higher than the conventional PRAM obtained when using the PRAM of the present invention. Using this result, the temperature of the phase-change layer 29 of the PRAM of the present invention can be increased significantly while significantly reducing the supplied current necessary to increase the phase-change layer 29 to this temperature compared to the conventional PRAM.

According to the present invention, a PRAM device has been described in which consumption of a supply current (e.g., reset and set current) required for a phase change of a phase-change layer of the PRAM device can be minimized by forming nanowires on the bottom of the phase-change layer so that a contact area with the phase-change layer is minimized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase-change random access memory (PRAM) device comprising:
    a lower structure;
    a plurality of contact plugs extending from the lower structure;
    a plurality of nanowires extending from respective terminal ends of the plurality of contact plugs, and wherein the nanowires are formed within the contact plugs; and
    a phase-change layer formed on the one end of the contact plugs.

2. The PRAM device of claim 1, wherein the nanowires extend into the contact plugs.

3. The PRAM device of claim 1, wherein the lower structure comprises:
    a semiconductor substrate;
    a source region and a drain region formed at sides of the semiconductor substrate; and
    a gate insulating layer and a gate electrode layer sequentially formed on the semiconductor substrate, the gate insulating layer contacting the source region and the drain region, wherein the contact plugs are respectively formed on the source region and the drain region.

4. The PRAM device of claim 3, further comprising a metal layer formed between the contact plugs and the respective source and drain regions.

5. The PRAM device of claim 1, wherein each of the contact plugs are formed of at least one selected from the group consisting of Si, SiGe, GaAs, GaN and SiC.

6. The PRAM device of claim 1, wherein each of the nanowires are formed of at least one selected from the group consisting of Au, Ag, Al, Cu, Cr, Co, Ni, Ti, Sb, V, Mo, Ta, Nb, Ru, W, Pt, Pd, Zn and Mg.

7. The PRAM device of claim 1, wherein the phase-change layer is formed of a GeSbTe.

8. The PRAM device of claim 1, further comprising an upper electrode formed on the phase-change layer.

9. The PRAM device of claim 1, further comprising a metal layer formed beneath the contact plugs.

* * * * *